United States Patent
Gomez et al.

(10) Patent No.: US 7,088,975 B1
(45) Date of Patent: Aug. 8, 2006

(54) AUTOMATIC GAIN CONTROL SYSTEM AND METHOD USING MULTIPLE LOCAL AGC LOOPS

(75) Inventors: Ramon A Gomez, San Juan Capistrano, CA (US); Dana V Laub, Irvine, CA (US); Adel Fanous, Irvine, CA (US); Lawrence M Burns, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 420 days.

(21) Appl. No.: 10/265,724

(22) Filed: Oct. 8, 2002

Related U.S. Application Data

(63) Continuation of application No. 10/215,046, filed on Aug. 9, 2002, now abandoned.

(60) Provisional application No. 60/344,373, filed on Jan. 4, 2002.

(51) Int. Cl.
- H04B 1/06 (2006.01)
- H03F 3/68 (2006.01)
- H04N 7/16 (2006.01)

(52) U.S. Cl. .............................. 455/232.1; 455/245.2; 455/253.2; 455/127.3; 330/124 R; 330/84; 725/127

(58) Field of Classification Search .. 455/232.1–253.2, 455/296, 303, 311, 127.2, 127.3; 330/75, 330/98, 84, 124 R, 254, 260; 348/725, 528; 725/127, 149
See application file for complete search history.

(56) References Cited

U.S. PATENT DOCUMENTS

| | | | | |
|---|---|---|---|---|
| 3,667,043 | A * | 5/1972 | Ahlgren ........................ 455/17 |
| 4,776,040 | A * | 10/1988 | Ichikawa et al. ............ 455/315 |
| 5,179,730 | A * | 1/1993 | Loper .......................... 455/266 |
| 5,930,692 | A * | 7/1999 | Peterzell et al. ............. 455/217 |
| 5,956,098 | A * | 9/1999 | Mizukami et al. ........... 348/735 |
| 6,091,441 | A * | 7/2000 | Al-Araji et al. ............ 455/3.02 |
| 6,177,964 | B1 * | 1/2001 | Birleson et al. ............. 348/725 |
| 6,363,262 | B1 * | 3/2002 | McNicol ..................... 455/561 |
| 6,483,355 | B1 * | 11/2002 | Lee et al. .................... 327/113 |
| 6,498,927 | B1 * | 12/2002 | Kang et al. ............... 455/245.2 |
| 6,530,088 | B1 * | 3/2003 | Brickell et al. .............. 725/127 |
| 6,838,937 | B1 * | 1/2005 | Fanous et al. ........... 330/124 R |
| 2001/0041584 | A1 * | 11/2001 | Watanabe .................... 455/553 |
| 2003/0100281 | A1 * | 5/2003 | Zipper ..................... 455/234.1 |

* cited by examiner

*Primary Examiner*—Duc M. Nguyen
(74) *Attorney, Agent, or Firm*—Sterne, Kessler, Goldstein & Fox, P.L.L.C.

(57) ABSTRACT

A receiver comprises a first Variable Gain Amplifier (VGA) that amplifies an input signal in accordance with a first gain to produce a first amplified signal. The first gain is controlled based on the first amplified signal. The receiver includes a second VGA that produces a second amplified signal responsive to the first amplified signal. The second VGA has a second gain controlled based on the second amplified signal.

8 Claims, 6 Drawing Sheets

Multiple-tuner receiver with local AGC loops

Figure 4. Multiple-tuner receiver with local AGC loops

AUTOMATIC GAIN CONTROL SYSTEM AND METHOD USING MULTIPLE LOCAL AGC LOOPS

CROSS-REFERENCE TO RELATED APPLICATIONS

This application claims priority to U.S. Provisional Application No. 60/344,373, filed Jan. 4, 2002, entitled "Automatic Gain Control System and Method Using Multiple Local AGC Loops," incorporated herein by reference in its entirety.

BACKGROUND OF THE INVENTION

1. Field of the Invention

The present invention relates generally to receivers, and more particularly, to multi-channel receivers using automatic gain control.

2. Related Art

Many communication receivers employ Automatic Gain Control (AGC) circuits to maintain a received signal within a dynamic range of the receiver. Typically, the AGC includes a signal level detector to indicate whether an output power level of the receiver is too strong or too weak, and gain control to adjust one or more amplifiers in response to the power level, thereby establishing a proper output power level. This operation attempts to balance the detrimental but competing effects of noise and distortion.

Existing tuners typically rely on an external level detector, which is part of a larger receiver system, of which the tuner is also a part. This level detector is responsive only to the output of the tuner. At this point, all received channels (for example, TV channels) except a desired channel have been removed by one or more stages of Intermediate Frequency (IF) filtering. An output of the level detector is compared to a reference level, and from this comparison a feedback gain control signal for the tuner is derived. The gain control signal causes an increase or decrease in receiver gain, as appropriate. This feedback signal may be filtered to obtain a desired AGC system characteristic.

Some conventional tuners have two Variable Gain Amplifiers (VGAs): for example, a Radio Frequency (RF) VGA in an RF stage and an IF VGA in an IF stage following the RF stage. A single gain control signal, derived in the IF stage, feeds both VGAs. If two channels, including a desired channel and an adjacent undesired channel are present in a received signal, and the desired channel is much weaker than the adjacent channel, a conventional AGC will often allow too much gain in the RF stage, since the conventional AGC is responsive to only the desired channel level (in the IF stage). Excessive distortion will then result from the presence of the large adjacent channel. There is a need therefore for an AGC system that overcomes the above-mentioned and other related problems in conventional receivers.

SUMMARY OF THE INVENTION

An embodiment of the present invention is directed to an AGC system including multiple, independent, AGC loops. The AGC system includes a first VGA that amplifies an input signal in accordance with a first gain to produce a first amplified signal, wherein the first gain is controlled based on the first amplified signal. The AGC system includes a second VGA that produces a second amplified signal responsive to the first amplified signal, wherein the second VGA has a second gain controlled based on the second amplified signal. The first and second VGAs form part of respective first and second AGC loops, which operate independent of each other.

An exemplary environment for the AGC system is a television (TV) and satellite broadcast tuner. As used in the tuner, the AGC system uses multiple distributed gain controllers (GCs) and VGAs to provide nearly optimal receiver dynamic range in the presence of multiple signal carriers, for example, multiple TV channels, having uneven relative levels and unpredictable levels. This situation is common in cable and terrestrial television systems and in satellite broadcast systems.

According to an embodiment of the present invention, all of the gain controllers used in the AGC system are internal to the tuner (be it a module or Integrated Circuit (IC)). Optimally, there is one gain controller and one local AGC loop after each significant bandwidth reduction in the tuner. Such bandwidth reductions typically occur after an IF filter stage. There is also an RF gain controller and AGC loop. Each AGC loop operates independently of the other AGC loops in the present invention.

Some of the AGC loops may be eliminated for simplicity, at the expense of performance, as dictated by tuner cost and size constraints.

In a double conversion television tuner embodiment, for example, there is an RF AGC loop including a Low Noise Amplifier (LNA), a first IF AGC loop, and a second IF AGC loop. Each loop operates independently of the other AGC loops.

ADVANTAGES

1. The present invention improves receiver dynamic range in the face of variations in block gains throughout the receiver, for example, tuner, signal path. These gain variations are commonly due to thermal effects, component tolerances and IC process variations.

2. The present invention adjusts dynamic range optimally for each section of the receiver (for example, an RF section, a first IF section following the RF section, and a second IF section following the first IF section) based on all the channels present in that section. For example, if two channels including a desired channel and an adjacent undesired channel are present, and the desired channel is much weaker than the adjacent channel, a conventional AGC will often allow too much gain preceding the section, since the conventional AGC is responsive to only the desired channel level. Excessive distortion will then result from the presence of the large adjacent channel.

On the other hand, the present invention advantageously uses a local, independent AGC loop to takes into account both channels. This approach strikes an optimum balance between noise and distortion, considering the unequal signal levels, for the desired channel.

This is also true for the multi-channel case having with more than two tones/channels.

Other embodiments of the present invention are apparent from the ensuing description.

BRIEF DESCRIPTION OF THE DRAWINGS/FIGURES

DETAILED DESCRIPTION OF THE INVENTION

Figure 1:
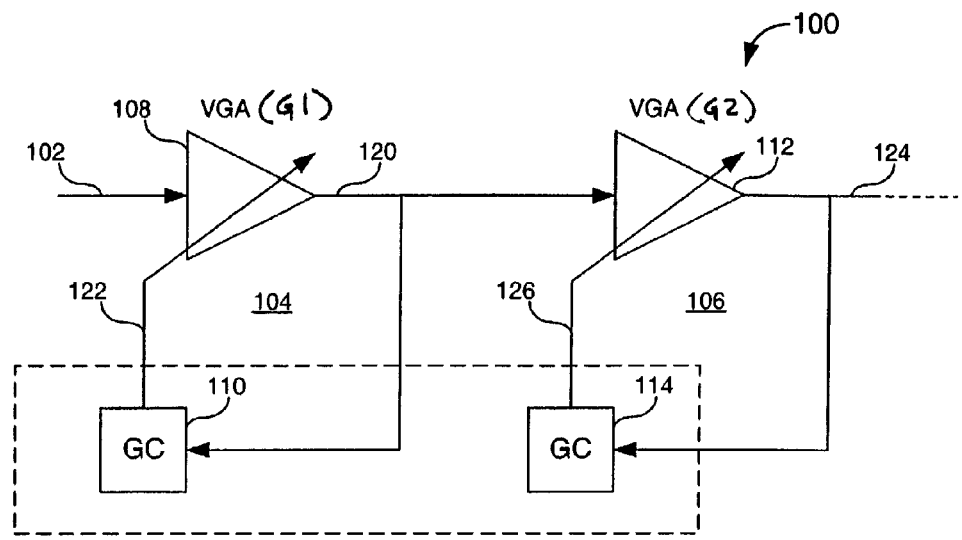
FIG. 1 is a block diagram of an example receiver including multiple independent AGC loops for processing an input or received signal.

FIG. 1 is a block diagram of an example receiver 100 for processing an input or received signal 102. Receiver 100 includes a first AGC loop (or "stage") 104 coupled to a second AGC loop 106. Receiver 100 may include further AGC loops similar to loops 104 and 106, but not shown in FIG. 1. AGC loop 104 includes a VGA 108 coupled to a gain controller (GC) 110. AGC loop 106 includes a VGA 112 coupled to a GC 114.

VGA 108 amplifies input signal 102 in accordance with a gain G1 of VGA 108, to produce an amplified output signal 120. Responsive to amplified signal 120, GC 110 generates a gain control signal 122 for controlling, for example, varying gain G1. GC 110 provides gain control signal 122 to a gain control input of VGA 108. VGA 108, signal 120, GC 110, and signal 122 form AGC loop 104.

VGA 108 is coupled to VGA 112 of AGC loop 106. VGA 112 amplifies signal 120 in accordance with a gain G2 of VGA 112, to produce an amplified signal 124. Responsive to amplified signal 124, GC 114 generates a gain control signal 126 for controlling gain G2. Thus, GCs 110 and 114 respectively control gains G1 and G2 responsive to, that is, based on, respective amplified signals 120 and 124.

AGC loops 104 and 106 operate independently of each other in that neither loop breaks the continuity of the other loop. For example, AGC loop 106 does not intervene between VGA 108 and GC 110, and AGC loop 104 does not intervene between VGA 112 and GC 114. In addition, AGC loops 104 and 106 are not nested within each other. Also, GC 110 generates control signal 122 directly responsive to amplified signal 120. The term "directly" means without an intervening action of another AGC loop (for example, AGC loop 106).

GCs 110 and 114 are depicted as separated gain controllers in FIG. 1. In an alternative arrangement, GCs 110 and 114 may be combined into a single GC, depicted in dotted line in FIG. 1, so long as gain G1 of VGA 108 is controlled responsive to amplified signal 120 and gain G2 of VGA 112 is controlled responsive to signal 124. For example, a single GC may alternately operate on signal 120 to derive signal 122 and on signal 124 to derive signal 126.

Figure 2:
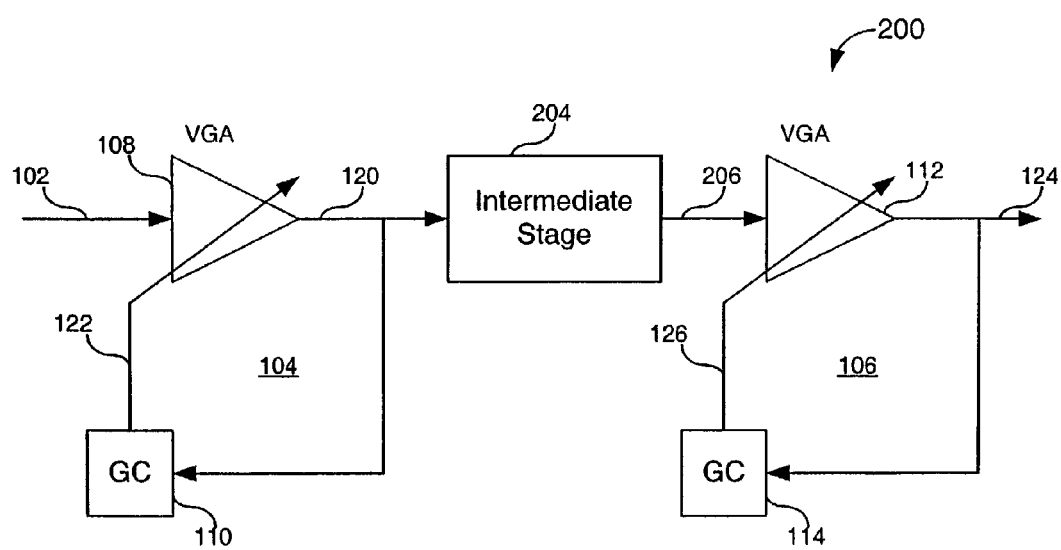
FIG. 2 is block diagram of another example receiver for processing an input signal using multiple independent AGC loops.

FIG. 2 is another example receiver 200 for processing input signal 102 using multiple AGC loops 104 and 106. A difference between receiver 100 in FIG. 1 and receiver 200 in FIG. 2 is that in receiver 100, AGC loops 104 and 106 are directly coupled to each other, whereas in receiver 200, AGC loop 104 is indirectly coupled to AGC loop 106. For example, in receiver 100, an output of VGA 108 is directly coupled to an input of VGA 112, whereas in receiver 200, the output of VGA 108 is coupled to the input of VGA 112 through an intermediate processing stage 204 between VGAs 108 and 112.

With reference to FIG. 2, intermediate stage 204 processes amplified signal 120 to produce a processed signal 206, and provides the processed signal to the input of VGA 112. VGA 112 amplifies signal 206, to produce amplified signal 124. Thus, VGA 206 produces amplified signal 124 responsive to, or based on, amplified signal 120.

Intermediate stage 204 may include a frequency converter, such as a frequency mixer, for frequency-converting signal 120 to a higher or lower frequency. Additionally, or alternatively, intermediate stage 204 may include a filter for reducing a bandwidth of signal 120. In this case, intermediate stage 204 operates as a bandwidth reduction stage.

For example, in an arrangement where signal 120 includes a plurality of frequency channels spaced apart from each other, intermediate stage 204 may select a subset of the channels and pass the selected subset of channels only to signal 206 (and thus, to the input of amplifier 112). Intermediate stage 204 may include other components, such as attenuators, amplifiers, or any other known processing element that may transform signal 120 to signal 206.

Figure 3:
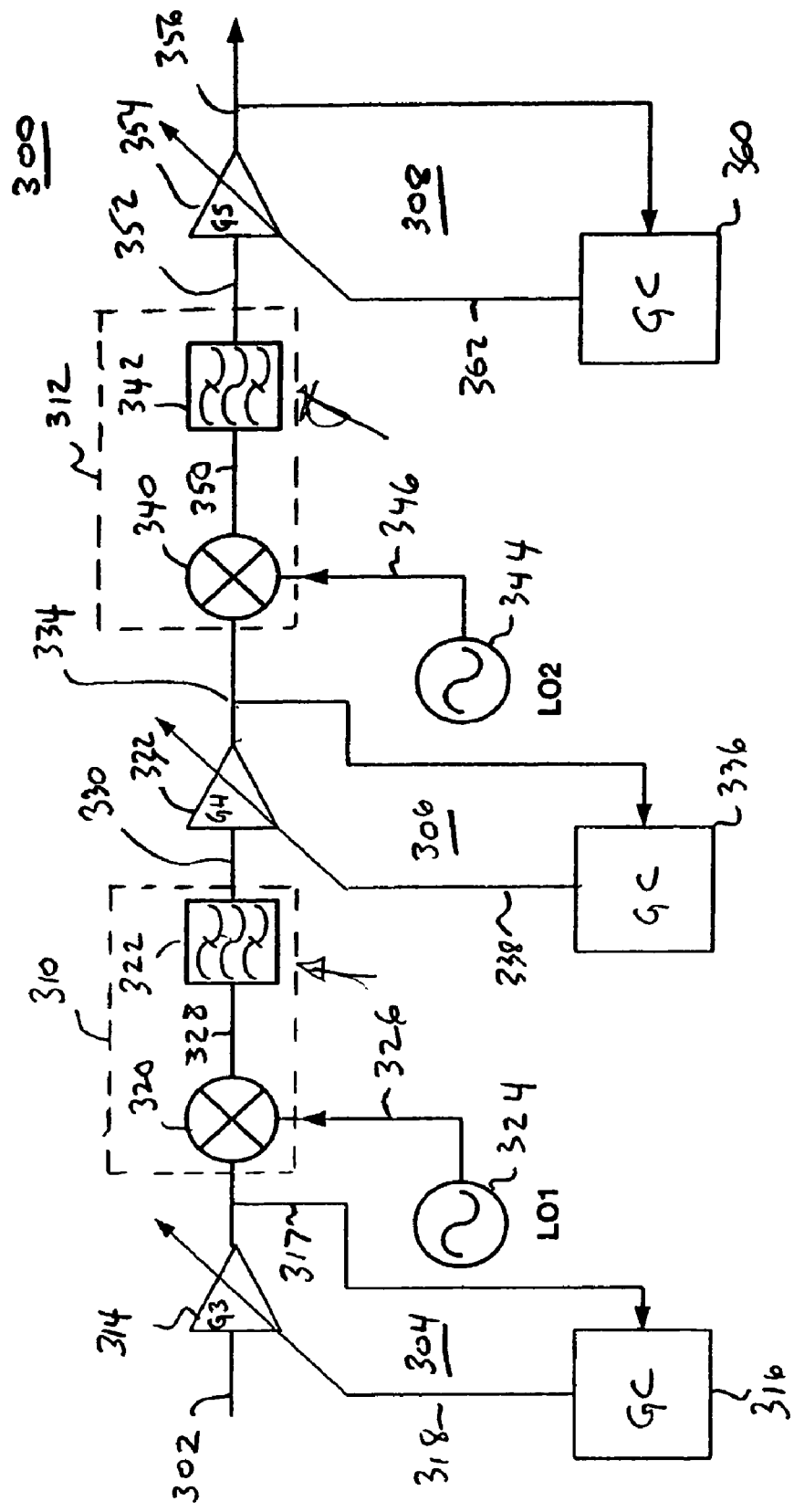
FIG. 3 is a block diagram of another example receiver for processing an input signal using multiple independent AGC loops.

FIG. 3 is a block diagram of an example double downconversion receiver 300 for processing an input signal 302. Receiver 300 includes multiple independent AGC loops 304, 306 and 308 coupled to each other through intermediate stages 310 and 312. In an exemplary arrangement, receiver 300 is constructed on a single Integrated Circuit (IC) chip.

An example input signal 302 is a satellite television (TV) or cable TV (CATV) signal including a plurality of TV channels spaced 6 MHz apart from each other and extending between 50 MHz and 860 MHz, for example. The channels present in signal 302 may have an exemplary total power (that is, combined power) of 35 decibel-millivolts (dBmV). A single channel may have a power level as low as −20 dBmV. More generally, input signal 302 may be any communication signal, or the like, including a plurality of frequency-spaced channels. For example, input signal 302 may include cable modem data channels and/or telephone signals.

AGC loop 304 includes an RF LNA/VGA 314 coupled to a GC 316. VGA 314 amplifies signal 302 in accordance with a gain G3 of the VGA, to produce an amplified signal 317. Amplified signal 317 includes the plurality of channels of signal 302. Responsive to amplified signal 317, GC 316 derives a gain control signal 318 for controlling gain G3.

An exemplary arrangement of GC 316 determines a power level of signal 317, representing a combined power of the plurality of channels in signal 317, and generates control signal 318 based on the power level. Thus, gain G3 of VGA 314 is responsive to the power of signal 317. In an exemplary arrangement, AGC loop 304 increases gain G3, decreases gain G3, or maintains gain G3 at a present value, as the power of signal 317 decreases, increases, or maintains a present value, respectively.

VGA 314 produces amplified signal 317 at an output of the VGA, and GC 310 receives signal 317 at an input of the GC. The output of VGA 314 may be coupled directly to the input of GC 310 (as depicted in FIG. 3), or indirectly, through any of a variety of signal conditioning components, such as a filter, an attenuator, a power splitter, an impedance matching circuit, an amplifier, a digital-to-analog converter (DAC), and so on between the VGA and the GC, so long as GC 316 generates gain control signal 318 responsive to amplified signal 317 (for example, so long as GC 316 receives a signal indicative of the power level of signal 317).

VGA 314 provides amplified signal 317 to intermediate stage 310. Intermediate stage 310 includes a mixer 320 followed by a channel selection filter 322, also referred to as a channel selector 322. A local oscillator 324 (LO1) generates an LO signal 326. Mixer 320 frequency up-converts signal 317 to an IF signal 328 having a first IF frequency greater than a frequency of signal 317. In an alternative arrangement, LO 324 and mixer 320 are arranged to frequency down-convert signal 317. Filter 322 may be a bandpass filter (BPF), a lowpass filter (LPF), a highpass filter (HPF), or any combination thereof. Filter 322 provides a filtered IF signal 330, having the first IF frequency, to a VGA 332 of AGC loop 306. Filter 322 selects and passes on to VGA 332 only a selected subset, for example, two or three, of the many TV channels present in signal 302 (and also present in signals 317 and 328).

VGA 332 amplifies signal 330 (and the selected subset of channels therein) in accordance with a VGA gain G4 to produce an amplified signal 334, which also includes the subset of channels. In response to amplified signal 334, a GC 336 of AGC loop 306 generates a gain control signal 338 for controlling gain G4 of amplifier 332. GC 336 generates gain control signal 338 based on a combined power of the subset of channels in signal 334. Thus, gain G4 is controlled based on the combined power of only the selected subset of channels, which may be substantially less than the combined power of all of the channels present in signal 317, for example.

VGA 332 provides amplified signal 334 to intermediate stage 312 including a mixer 340 followed by a filter 342. A local oscillator 344 (LO2) generates an LO signal 346, and provides the LO signal to mixer 340. Mixer 340 frequency down-converts signal 334 to an IF signal 350 having a second IF frequency that is less than the first IF frequency.

Filter 342 filters signal 350 to produce a filtered IF signal 352, and provides filtered signal 352 to a VGA 354 of AGC loop 338. Filter 342 selects and passes on to VGA 354 preferably only a selected one of the subset of channels present in signal 334 (and 350). Filter 342 may be a BPF, a LPF, a HPF, or a combination thereof, for example.

VGA 354 amplifies signal 352, and the selected channel therein, in accordance with a gain G5, to produce an amplified IF signal 356 including the one channel. A GC 360 of AGC loop 308 generates a gain control signal 362 for controlling gain G5, based on a power level of signal 356. Thus, AGC loop 308 controls gain G5 based on the power of only the one selected channel in signal 356.

Below is a list of various example frequency-based characteristics for signals and components of receiver 300:

LO 324 generates LO signal 326 with a tunable frequency over the frequency range of 1270 MHz to 2060 MHz;

the first IF frequency is approximately 1220 MHz;

filter 322 is a BPF having a 3 dB passband bandwidth sufficiently narrow to select several channels, such as three, four or five channels. For example, filter 322 is a BPF having a 3 dB passband bandwidth of approximately 19 MHz centered around the first IF frequency;

LO 344 generates LO signal 346 at a finely tunable frequency of approximately 1176 MHz;

the second IF frequency is approximately 44 MHz; and filter 342 is a BPF having a 3 dB passband bandwidth of approximately 6 MHz centered around the second IF frequency.

Figure 4:
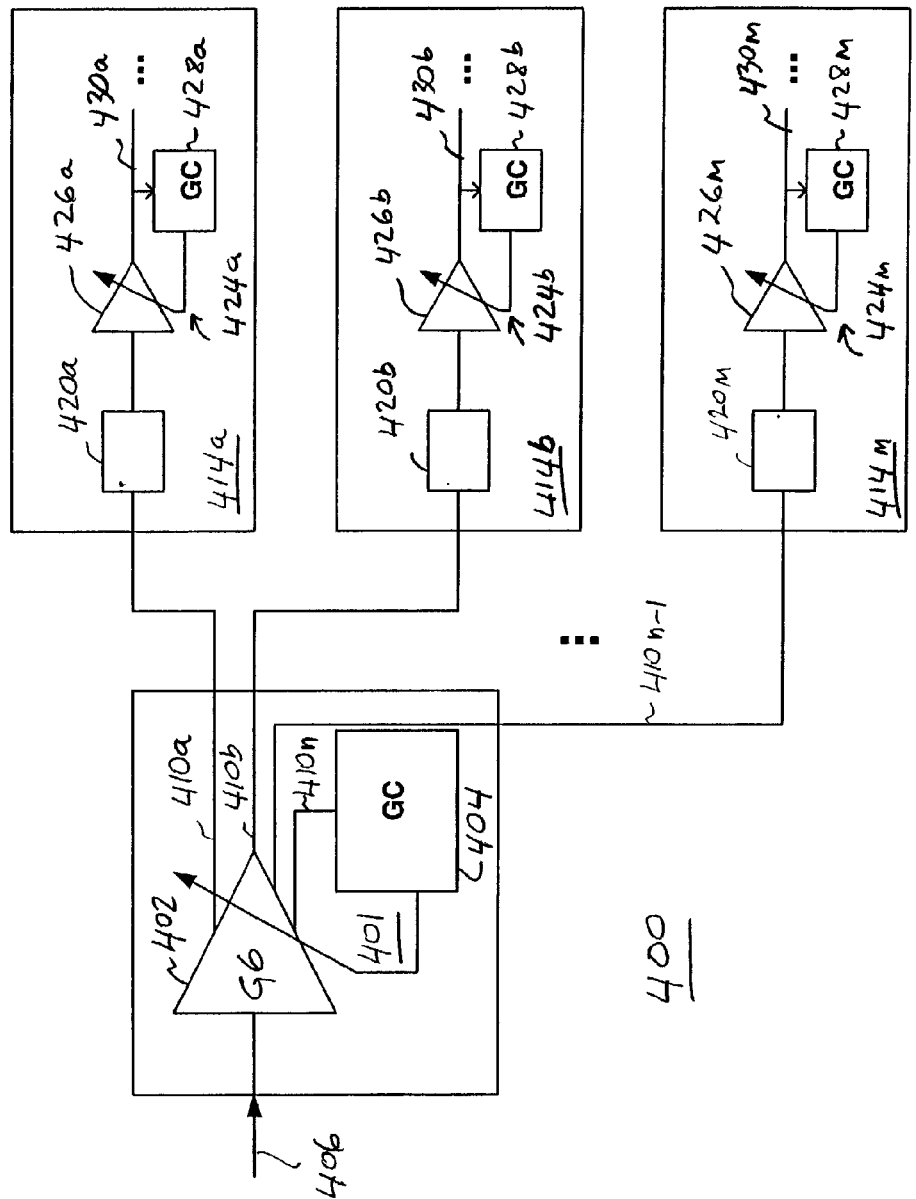
FIG. 4 is a block diagram an example receiver/AGC system 400 including multiple parallel tuners and multiple independent AGC loops.

FIG. 4 is a block diagram an example receiver/AGC system 400 including multiple parallel tuners and multiple independent AGC loops. The multiple independent AGC loops of receiver 400 operate in accordance with the principles described above. Receiver 400 includes a first-stage or upstream independent AGC loop 401. Upstream AGC loop 401 includes an upstream LNA/VGA 402 coupled to an upstream GC 404. VGA 402 produces, from an input signal 406, a plurality of amplified signals 410a–410n (also referred to as upstream amplified signals 410a–410n) in parallel with each other. Input signal 406 may be a channelized signal, such as signal 302. VGA 402 amplifies input signal 406 in accordance with an upstream gain G6 to produce amplified upstream signals 410. VGA 402 may include one or more power dividers or amplifiers with inputs connected in parallel, or any other arrangement for producing parallel amplified signals 410a–410n from input signal 406.

GC 404 receives parallel amplified signal 410n, and controls upstream gain G6 based on a power of that signal, in the same manner as described above. Alternatively, GC 404 may receive any of the other amplified signals 410a–410n−1, instead of signal 410n, and control upstream gain G6 based on that other signal.

Receiver 400 also includes a plurality of second-stage or downstream parallel receiver sections (also referred to as parallel tuners) 414a–414m, following and coupled to VGA 402. Each of the receiver sections 414a–414m receives and operates on a respective one of parallel upstream amplified signals 410a–410n−1. For example, downstream receiver sections 414a, 414b and 414m respectively receive and operate on upstream amplified signals 410a, 410b and 410n−1.

In the example arrangement depicted in FIG. 4, downstream receiver section 414a includes an optional signal processing block 420a followed by an AGC loop 424a. Signal processing block 420a is similar to or the same as intermediate stage 204. AGC loop 424a, including a VGA 426a and a GC 428a (referred to as a downstream VGA and a downstream GC, respectively), is similar to or the same as AGC loops 104, 304, 306 and 308, etc., described previously. Alternatively, downstream receiver section 414a may be configured similar to or the same as receiver 300. At least two of the downstream receiver sections 414a–414m includes an independent AGC loop, as described above. Downstream receiver sections 414a–414m may have configurations similar to each other as depicted in FIG. 4, or configurations different from each other.

Downstream AGC loop 424a operates in the manner described above. Namely, VGA 426a produces an amplified signal 430a (referred to as a downstream amplified signal 430a) responsive to upstream amplified signal 410a and in accordance with a gain (referred to as a downstream gain) of VGA 426a. GC 428a controls the gain of VGA 426a based on a power of amplified signal 430a. Downstream AGC loop 424b operates in a similar manner, but is responsive to upstream signal 410b.

Figure 5:
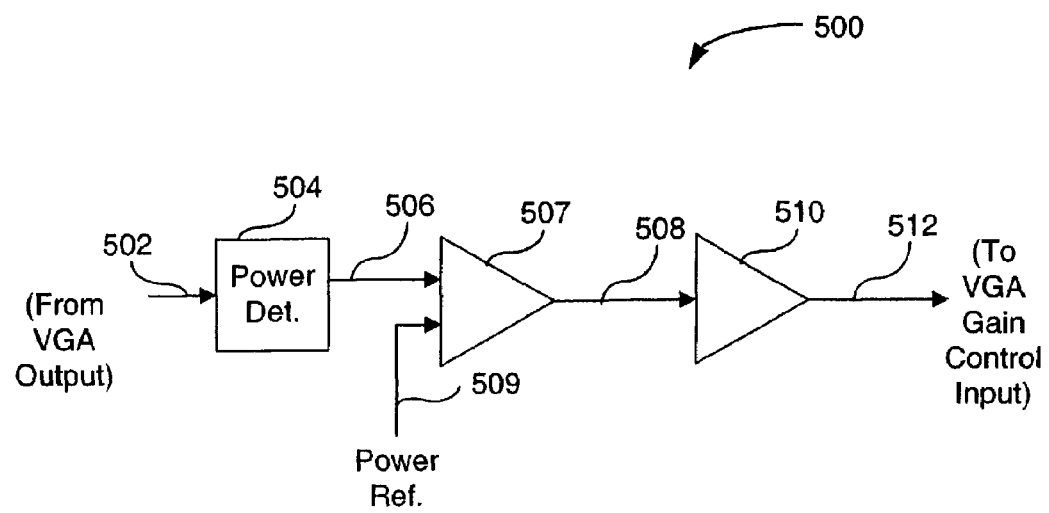
FIG. 5 is a block diagram of an example gain controller that may be used in receivers of FIGS. 1–4.

FIG. 5 is a block diagram of an example GC 500 that may be used in receivers 100–400. GC 500 receives a signal 502 (for example, amplified signal 317). A detector 504 produces a detected power signal (or level) 506 representative of a power level of signal 502. A comparator amplifier 507 generates an error signal 508 (also representative of the power level of signal 502) based on detected power signal 506 and a reference power level 509 applied to the comparator amplifier. A filter/amplifier 510 filters and amplifies error signal 508, to produce a gain control signal 512 (for example, gain control signal 318) for controlling the gain of a VGA, and applies the gain control signal to the VGA. Thus, GC 500 determines a power of signal 502 and generates gain control signal 512 based on the determined (for example, detected) power. In a simpler arrangement of the GC, the GC includes detector 504 only.

In the example systems of FIGS. 1–5, the various signals, such as received and amplified signals, frequency converted signals, gain control signals, and so on, may be continuous-time signals or discrete time (such as sampled) signals. Each gain control signal may be digital control signal. Also, the AGC loops may be implemented using digital and/or analog circuits.

Figure 6:
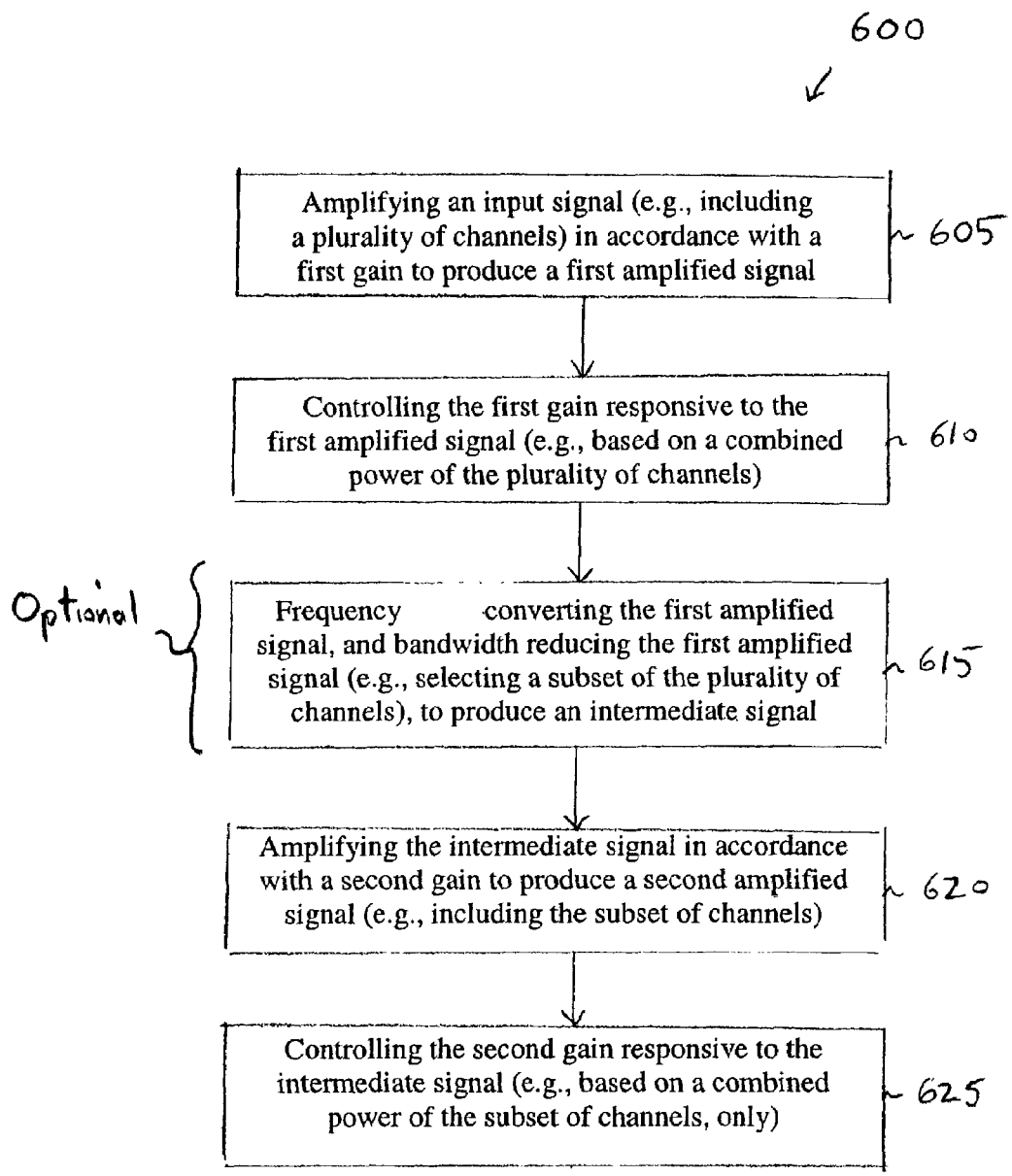
FIG. 6 is a flow chart of an example method that may be implemented in a receiver including multiple independent AGC loops.

FIG. 6 is a flow chart of an example method of processing an input or received signal, that may be implemented in receivers 100–400 described above, for example. An example input signal, such as signal 302, includes a plurality of frequency-spaced channels.

A first step 605 includes amplifying the input signal in accordance with a first gain to produce a first amplified signal. For example, VGA 314 produces amplified signal 317 in accordance with gain G3.

A next step 610 includes controlling the first gain responsive to the first amplified signal. For example, GC 316 controls gain G3 based on a combined power of the plurality of channels in signal 317.

A next, optional, step 615 includes frequency converting (for example, frequency up-converting, or alternatively, frequency down-converting) and bandwidth reducing the first amplified signal, to produce an intermediate signal. For example, intermediate stage 310 frequency up-converts amplified signal 317, and passes a selected subset of the plurality of channels, to IF signal 330. In alternative arrangements of step 615, frequency converting, or alternatively, bandwidth reducing, may be omitted.

A next step 620 includes amplifying the intermediate signal in accordance with a second gain to produce a second amplified signal. For example, VGA 332 produces amplified signal 334 (responsive to signal 317) in accordance with gain G4.

A next step 625 includes controlling the second gain responsive to the intermediate signal. For example, GC 336 controls gain G4 based on a combined power of the subset of channels, only.

Method 600 may include a series of further steps similar to steps 615, 620 and 625.

Figure 7:
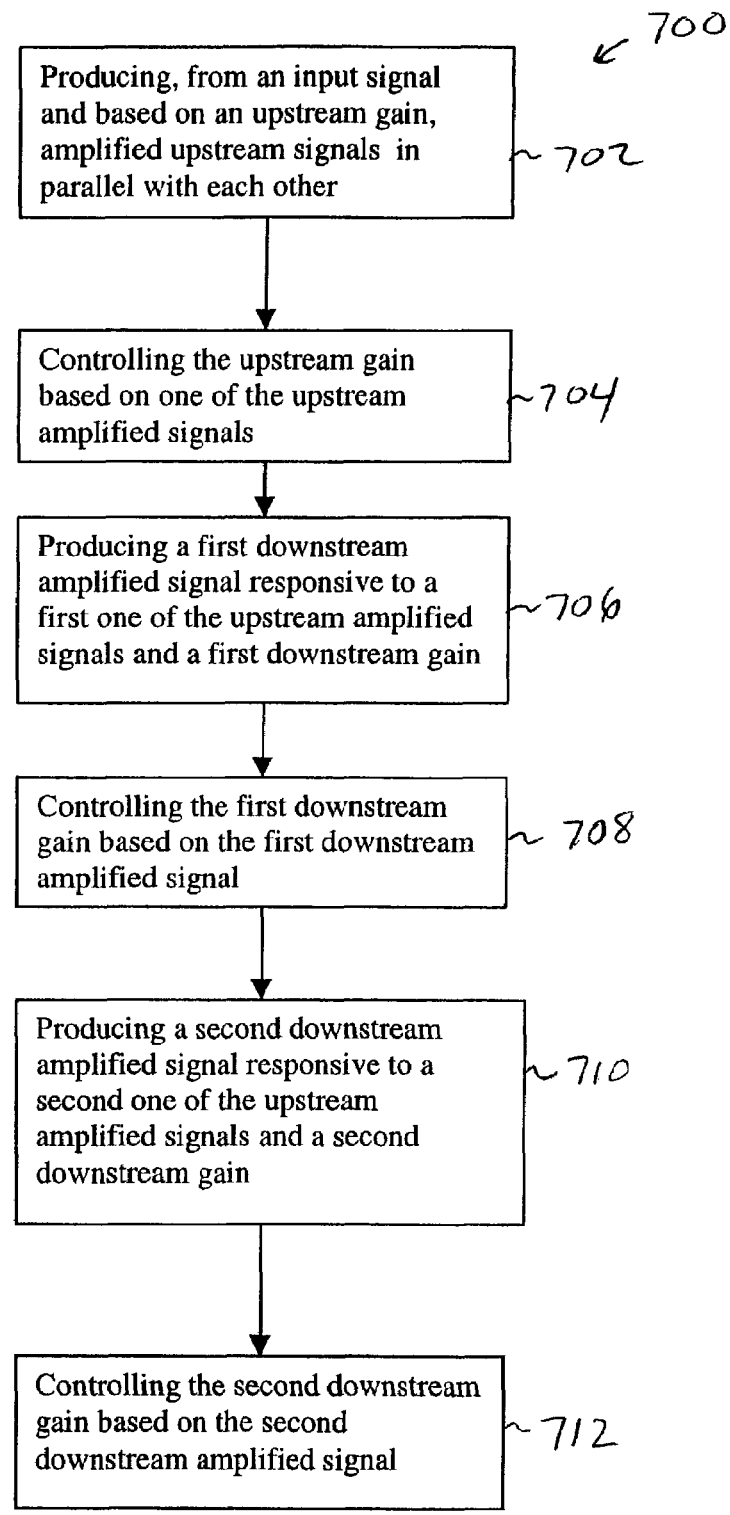
FIG. 7 is a flow chart of an example method of processing an input or received signal, that may be implemented in a receiver including multiple parallel independent AGC loops, such as the receiver of FIG. 4.

FIG. 7 is a flow chart of an example method 700 of processing an input or received signal, that may be implemented in a receiver including multiple parallel independent AGC loops, such as receiver 400.

A first step 702 includes producing, from an input signal (e.g., signal 406) and based on an upstream gain (e.g., gain G6), amplified upstream signals in parallel with each other (e.g., signals 410).

A next step 704 includes controlling the upstream gain based on one of the upstream amplified signals.

A next step 706 includes producing a first downstream amplified signal (e.g., signal 430a) responsive to a first one of the upstream amplified signals (e.g., signal 410a) and a first downstream gain (e.g., of VGA 426a).

A next step 708 includes controlling the first downstream gain based on the first downstream amplified signal.

A next step 710 includes producing a second downstream amplified signal (e.g., signal 430b) responsive to a second one of the upstream amplified signals (e.g., signal 410b) and a second downstream gain (e.g., of VGA 426b).

A next step 712 includes controlling the second downstream gain based on the second downstream amplified signal.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

The invention claimed is:

1. An Automatic Gain Control (AGC) system, comprising:
   an upstream VGA that produces, from an input signal, multiple upstream amplified signals in parallel with each other, wherein the upstream VGA has an upstream gain controlled based on one of the multiple upstream amplified signals;
   a first downstream VGA that produces a first downstream amplified signal responsive to a first one of the multiple upstream amplified signals, wherein the first downstream VGA has a first downstream gain controlled based solely on the first downstream amplified signal; and
   a second downstream VGA that produces a second downstream amplified signal responsive to a second one of the multiple upstream amplified signals, wherein the second downstream VGA has a second downstream gain controlled based solely on the second downstream amplified signal.

2. The receiver of claim 1, further comprising:
   an upstream controller that generates an upstream gain control signal responsive to a power of the one of the multiple upstream amplified signals, and controls the upstream gain with the upstream gain control signal; and
   a first downstream controller that generates a first downstream gain control signal responsive to a power of the first downstream amplified signal, and controls the first downstream gain with the first downstream gain control signal.

3. The receiver of claim 2, further comprising:
   a second downstream controller that generates a second downstream gain control signal responsive to a power of the second downstream amplified signal, and controls the second downstream gain with the second downstream gain control signal.

4. The system of claim 1, wherein the input signal and each of the multiple amplified upstream signals includes a plurality of channels, and the upstream gain is controlled based on a combined power of the plurality of channels.

5. The system of claim 4, wherein the input signal is a TV signal and each of the plurality of channels is a TV channel.

6. The system of claim 4, further comprising:

a channel selection stage, coupled between the upstream VGA and the first downstream VGA, configured to pass only a selected subset of the plurality of channels to the first downstream VGA, the first downstream amplified signal including the selected subset of channels, wherein the first downstream gain is controlled based on a combined power of the selected subset of channels.

7. The system of claim 1, further comprising:

a mixer, coupled between the upstream VGA and the first downstream VGA, for frequency converting the first one of the multiple upstream amplified signals.

8. A method in a receiver, comprising:

(a) producing, from an input signal and based on an upstream gain, multiple amplified upstream signals in parallel with each other;

(b) controlling the upstream gain based on one of the multiple upstream amplified signals;

(c) producing a first downstream amplified signal responsive to a first one of the multiple upstream amplified signals and a first downstream gain;

(d) controlling the first downstream gain based solely on the first downstream amplified signal;

(e) producing a second downstream amplified signal responsive to a second one of the multiple upstream amplified signals and a second downstream gain; and (f) controlling the second downstream gain based solely on the second downstream amplified signal.

* * * * *